United States Patent [19]

Valentine

[11] Patent Number: 4,514,724
[45] Date of Patent: Apr. 30, 1985

[54] ELECTRICAL WARNING SYSTEM FOR MALFUNCTIONS IN REFRIGERATION

[75] Inventor: Walter J. Valentine, Bellmore, N.Y.

[73] Assignee: Paul W. Garbo, Freeport, N.Y.; a part interest

[21] Appl. No.: 425,874

[22] Filed: Sep. 28, 1982

[51] Int. Cl.³ .............................................. G08B 21/00
[52] U.S. Cl. ...................................... 340/648; 62/129; 318/490; 340/664; 324/133
[58] Field of Search .............. 340/648, 662, 664, 585; 318/490; 361/23, 30, 31, 32, 33, 34; 62/126, 129; 315/135; 324/133, 158 MG

[56] References Cited

U.S. PATENT DOCUMENTS

| | | | |
|---|---|---|---|
| 2,605,304 | 7/1952 | Proctor et al. ...................... | 324/101 |
| 2,654,860 | 10/1953 | Lewis .................................. | 318/490 |
| 3,041,520 | 6/1962 | Sidell .................................. | 318/490 |
| 3,482,236 | 12/1969 | Seney ............................... | 318/490 X |
| 3,795,830 | 3/1974 | Richardson ..................... | 315/135 X |
| 3,809,985 | 5/1974 | Krause et al. ........................ | 318/490 |
| 3,980,997 | 9/1976 | Berns et al. .......................... | 340/630 |
| 3,999,176 | 12/1976 | Kellogg et al. .................. | 340/648 X |
| 4,025,850 | 5/1977 | Spiteri ................................. | 324/133 |

FOREIGN PATENT DOCUMENTS 44-11228  5/1969  Japan ................................... 318/490

Primary Examiner—James L. Rowland
Assistant Examiner—Daniel Myer
Attorney, Agent, or Firm—Paul W. Garbo

[57] ABSTRACT

An electrical warning system for malfunctions in refrigeration equipment driven by an electric motor comprises a main resistor connected in series with the motor to cause only a small voltage drop in the power supply to the motor, a high amp shunt across the main resistor comprising a diode, resistor and light-emitting diode, and a low amp shunt across the main resistor comprising a diode and light-emitting diode with the latter having in parallel a capacitor as well as a resistor in series with a zener diode.

8 Claims, 1 Drawing Figure

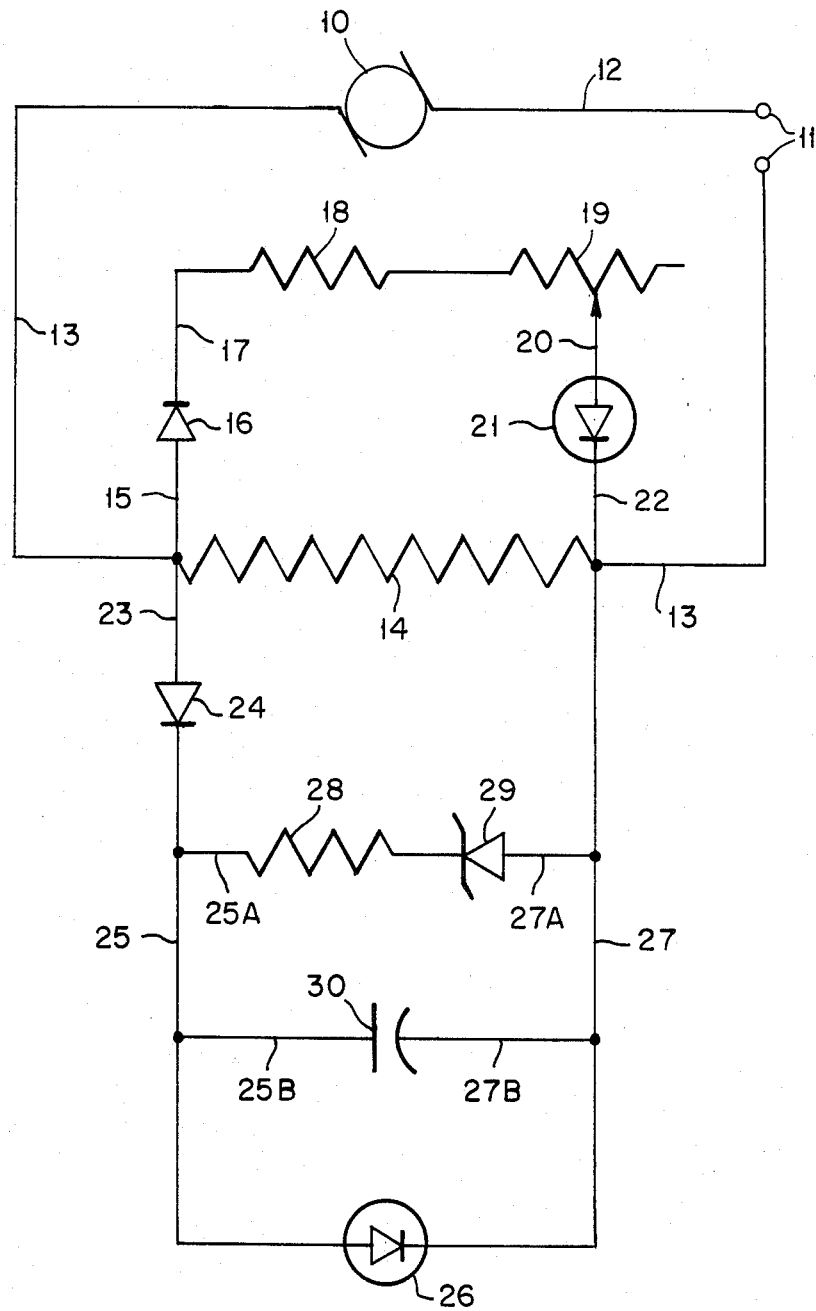

ELECTRICAL WARNING SYSTEM FOR MALFUNCTIONS IN REFRIGERATION

BACKGROUND OF THE INVENTION

This invention relates to a warning system for refrigeration equipment which indicates when such equipment requires corrective maintenance to prevent continuance of an operational deficiency or malfunction until the refrigeration equipment becomes inoperable. More particularly, the warning system of the invention involves an electrical circuit connected in series with the electric motor which drives the refrigerant compressor of the refrigeration equipment.

Refrigeration equipment, which broadly includes freezers, coolers, refrigerators and air conditioners, has been the subject of many proposed warning systems designed to call attention to various mechanical or electrical malfunctions of the equipment. However, these prior proposals have failed to gain wide commercial adoption because of their complexity and high cost.

For example, U.S. Pat. No. 2,475,069 to Wood discloses a warning device for a refrigerant system comprising a fluid pressure reponsive means connected between the evaporator and the compressor of the system. Wood's device requires both fluid and electrical connections and is itself subject to malfunction because it includes a bellows which is a potential source of leaking refrigerant.

U.S. Pat. No. 3,415,070 to Weum shows a refrigeration malfunction warning system that includes: a jacket surrounding a refrigerant liquid header connected to receive a small amount of refrigerant liquid from the end of the header, and an electrical temperature sensor associated with the jacket. This complex system also requires both fluid and electrical connections. Worse yet, the jacket of the proposed system as a practical matter could only be installed at the time the refrigeration system is built.

U.S. Pat. Nos. 2,826,044, 3,628,346 and 3,839,877 are illustrative of other warning systems for refrigeration equipment which are not simple and cannot be easily installed in existing refrigeration equipment.

Accordingly, a principal object of this invention is to provide a simple and easily installed warning system for refrigeration equipment to detect malfunctions.

Another important object is to provide such a warning system that avoids connection into the refrigerant fluid piping.

Still another object is to provide a warning system which is made up entirely of electrical components and is easily connected in series with the motor that drives the refrigerant compressor of the refrigeration equipment.

These and other objects and advantages of the invention will be evident from the description which follows.

SUMMARY OF THE INVENTION

In accordance with this invention, a warning system for indicating deficiencies or malfunctions in refrigeration equipment is a dual electrical circuit with a main resistor common to both parts of the circuit in which the main resistor is connected in series with the electric motor used to drive the refrigerant compressor. The main resistor of the dual electrical circuit is selected to impose a predetermined small voltage drop in the power line supplying the electric motor of the refrigerant compressor. Whether the alternating current supplied to the motor is nominally at 110 or 220 volts, the voltage drop imposed by the main resistor should desirably not exceed 5 volts and preferably should be about 2 volts. The two parts of the dual electric circuit which have the main resistor in common and are in parallel with the main resistor may be referred to as a high current shunt and a low current shunt around the main resistor.

The high current or amp shunt comprises a diode, a variable resistor and a light-emitting diode (LED), all connected in series.

The parallel low current or amp shunt comprises a diode and an LED connected in series, a capacitor connected in parallel with the LED and a zener diode in series with a resistor also connected in parallel with the LED of the low amp shunt.

In normal operation, the light-emitting diode of the low amp shunt remains lit indicating that the refrigeration equipment is operating well without any problem. For that reason, it is advisable to use an LED with a green case inasmuch as a green light indicates the sytem is "go".

To the contrary, the LED of the high amp shunt should desirably have a red case to warn when the light is on that trouble is developing because of a defective start-up capacitor or wiring, or a dirty evaporator. condenser or air filter, or inoperative fan.

While the LED of the high amp shunt is lit only when trouble begins, the LED of the low amp shunt is lit while the refrigeration equipment is operating normally and becomes unlit only when there is a loss of refrigerant, or a defective thermostat, or an obstruction in the refrigerant circulation, or an inoperative start-up capacitor or compressor.

Hence, when only the LED of the low amp shunt is lit, the refrigeration equipment is operating properly. When neither LED is lit and the refrigeration equipment is operating, the warning is that the equipment is drawing too low a current. Conversely, when both LEDs are lit, the warning is that the equipment is drawing too much current.

It is therefore amazing that by using two diodes, one zener diode, two light-emitting diodes, one capacitor and as few as three resistors it is possible to form a dual electrical circuit which when connected in series with the electric motor of the refrigeration equipment will act as an alarm indicating two types of problems: those causing a drop in the current flow to the motor and those causing a rise in that current flow.

Moreover, it is noteworthy that the elements of the electrical circuit are very small; the capacitor is less than 1 inch in length, the diodes as well as the zener diode are each less than 0.5 inch in length, and the LEDs are less than 0.25 inch in diameter. Hence, the alarm or warning system of this invention can be made a compact unit of the size of a cigarette pack.

BRIEF DESCRIPTION OF THE DRAWING

The further description of the invention will refer to the appended drawing which is the diagram of a preferred electrical circuit capable of acting as a warning system of developing troubles in the refrigeration equipment to which the warning system is connected.

DESCRIPTION OF PREFERRED EMBODIMENTS

Electric motor 10 which drives refrigerant compressor (not shown) is connected to electrical power source 11 by wires 12 and 13. Main resistor 14 of the warning system of this invention is connected in series with motor 10 by wire 13. The high amp shunt around resistor 14 is formed by wire 15, diode 16, wire 17, resistor 18, variable resistor 19, wire 20, LED 21 and wire 22, all connected in series but in parallel to resistor 14.

The low amp shunt around resistor 14 is formed by wire 23, diode 24, wire 25, LED 26 and wire 27, all connected in series, while resistor 28 in series with zener diode 29 is connected by wires 25A and 27A in parallel to LED 26, and capacitor 30 is also connected by wires 25B and 27B in parallel to LED 26. The three parallel branches of the low amp shunt need not be positioned relative to one another as shown in the drawing. Thus, LED 26 and capacitor 30 may switch places. Also, the branch with resistor 28 and zener diode 29 may be placed between the parallel branches with LED 26 and a capacitor 30. In short, any arrangement of the three parallel branches will not alter the performance of the low amp shunt so long as each of the three parallel branches is in series with diode 24.

It should be noted that a single fixed or variable resistor could replace resistor 18 and variable resistor 19 of the high amp shunt. A single fixed resistor has the disadvantage that a substantial increase in the ambient temperature will cause the LED of the high amp shunt to light and indicate some malfunction of the refrigeration when none is in fact present. Variable resistor 19 makes it possible to adjust its resistance in relation to the temperatures of the seasons so that LED 21 will light up only when motor 10 is drawing too much current because of a problem in the refrigeration equipment. On the other hand, a single variable resistor is dangerous because an inexperienced or careless person may adjust the resistance so low that the warning system will be damaged by a high current. The combination of fixed resistor 18 in series with variable resistor 19 avoids the disadvantages of using either one alone. The sequence of diode 16, wire 17, resistor 18, variable resistor 19, wire 20 and LED 21 may be changed to diode 16, wire 20, variable resistor 19, resistor 18, wire 17 and LED 21 without influencing the performance of the warning system.

As previously mentioned, the main resistor should be selected to have a voltage drop desirably not exceeding about 5 volts and preferably should be about 2 volts. There are two obvious reasons for selecting a main resistor with a low voltage drop: first, the house voltage should not be reduced materially before it reaches the electric motor of the refrigeration equipment or else the motor will operate less efficiently; second, wattage is wasted by the main resistor in direct relation to its voltage drop (watt=amps×volts).

Refrigeration equipment, such as air conditioners, refrigerators and freezers, operate with 60-cycle alternating current, in most cases at 110–120 volts or at 220–240 volts in the case of commercial-size-refrigeration equipment.

As a specific example of the invention, it is decided that main resistor 14 should have a voltage drop of 1.95 volts for an air conditioner operating on 60-cycle alternating current of 115 volts and drawing 7.5 amps of current. Hence, according to the equation: ohms=volts÷amps or $1.95 \div 7.5 = 0.26$ ohm, main resistor 14 is designed to have the predetermined resistance of 0.26 ohm. Resistor 14 can be simply formed by helically winding a nichrome ribbon 0.1875 inch wide, around a small ceramic core. Diodes 16 and 24 are commercially available as elements designed for service up to 200 volts and 1 amp. Capacitor 30 is the electrolytic type rated as 220 micro-farads and 35 volts. Zener diode 29 is rated as 1 watt and 4.3 volts, while LEDs 21 and 26 are each rated as 140 micro-watts and 3.0 volts. LED 21 has a red case and LED 26 has a green case. The resistance of resistor 28 is 27 ohms. Resistor 18 has a resistance of 1000 ohms and variable resistor 19 has a maximum resistance of 1000 ohms but is adjusted to give a resistance of about 400 ohms. All of the foregoing elements in the dual electrical circuit are readily available in stores selling electronic components. Even at retail prices, all of the elements can be purchased for less than $4.00.

In this example, when the air conditioner is operating normally and drawing 7.5 amps of 60-cycle alternating current (AC) supplied at 115 volts, diode 24 converts AC at 1.95 volts to direct current (DC) of about 1.5 volts. Capacitor 30 functions to restore the voltage of DC to 1.95 volts. DC at 1.95 volts is adequate to light up green LED 26 to indicate normal operation of the air conditioner. Simultaneously, diode 16 also converts AC at 1.95 volts to DC at about 1.5 volts. Hence, DC at 1.5 volts is already inadequate (disregarding the additional loss of voltage because of resistors 18 and 19) to light up red LED 21.

Assuming there has been a loss of refrigerant, motor 10 will draw less than 7.5 amps because of the reduced load on the compressor driven by motor 10. For example, if motor 10 draws 5.5 amps, the voltage drop across main resistor 14 is 1.43 volts. With such low voltage both the low amp shunt and the high amp shunt cannot supply DC at 1.95 volts to LEDs 21 and 26 and thus both are not illuminated.

On the other hand, assuming the condenser of the air conditioner is very dirty, the refrigerant will not be sufficiently cooled in the condenser so that the pressure of the refrigerant on the discharge side of the compressor will increase causing the load on motor 10 to rise. For example, if motor 10 now draws 10 amps, the voltage drop across main resistor 14 is 2.6 volts. With 2.6 volts imposed on the low amp shunt, green LED 26 remains lit. With 2.6 volts imposed on the high amp shunt, the voltage at LED 21 is now high enough to light up red LED 21.

It should be noted that the branch with resistor 28 and zener diode 29 which is in parallel with LED 26 of the low amp shunt is present to protect LED 26 from the surge in the voltage drop across main resistor 14 caused by the high current surge momentarily flowing through wires 12 and 13 at the instant that motor 10 starts up each time the thermostat of the refrigeration equipment calls for refrigeration. Hence, the branch with resistor 28 and zener diode 29 does not have a role in whether LED 26 remains lit or unlit while motor 10 is running. In other words, the branch with resistor 28 and zener diode 29 does not participate in the warning function of the system of this invention but protects LED 26 of the low amp shunt of the system from the voltage surge occurring across main resistor 14 each time motor 10 starts up. LED 21 of the high amp shunt is adequately protected from the voltage surge across main resistor 14 at start-up of motor 10. Such voltage surge causes LED 21 to light up momentarily but is meaningless if the light flash disappears. Of course, if LED 21 remains lit, it is giving the warning that the refrigeration equipment has a malfunction of the type known to cause motor 10 to draw an abnormally high current.

It should also be noted that the specific example of the warning system of the invention designed for use with refrigeration equipment operating on 60-cycle AC of 115 volts and normally drawing 7.5 amps can also be used with refrigeration equipment operating on 60-cycle AC of 230 volts provided the normal current drawn is also 7.5 amps. If such equipment normally drew 10 or 15 amps only main resistor 14 would require modification to maintain the original voltage drop thereacross of 1.95 volts. Thus, for 10 amps main resistor 14 should have a resistance of 0.195 ohm.

While the warning system of the invention should be a permanent part of every refrigeration equipment, particularly in view of its low cost, it can be a separate unit carried and used by refrigeration service men to test for malfunctions in refrigeration equipment. For such use, main resistor 14 should desirably be variable so that its resistance can be readily adjusted depending on the design or normal current drawn by the equipment under test. Of course, such separate unit would be connected in series with the electric motor of the refrigeration equipment to be tested by known clips or plugs. Other variations and modifications of the invention will be apparent to those skilled in the art without departing from the spirit or scope of the invention. Accordingly, only such limitations should be imposed on the invention are set forth in the appended claims.

What is claimed is:

1. An electrical warning system for malfunctions in refrigeration equipment driven by an alternating current motor, which comprises a main resistor connected in series with said motor and selected to cause a voltage drop in the power supplied to said motor not exceeding 5 volts, a high amp shunt connected in parallel to said main resistor comprising a first diode, a first resistor and a first light-emitting diode, all connected in series, and a low amp shunt connected in parallel to said main resistor comprising a second diode and a second light-emitting diode connected in series, with a capacitor connected in parallel to said second light-emitting diode, and with a second resistor and zener diode connected in series to each other and together connected in parallel to said second light-emitting diode.

2. The electrical warning system of claim 1 wherein the first resistor is a variable resistor.

3. The electrical warning system of claim 1 wherein the high amp shunt has an additional variable resistor connected in series with the first resistor which has a predetermined fixed resistance.

4. The electrical warning system of claim 1 wherein the main resistor is a variable resistor.

5. The electrical warning system of claim 1 wherein the main resistor is formed of nichrome ribbon.

6. The electrical warning system of claim 1 wherein the first light-emitting diode has a red case and the second light-emitting diode has a green case.

7. The electrical warning system of claim 1, 2, 3, 4, 5 or 6 wherein the main resistor is selected to cause a voltage drop of about 2 volts in the power supplied to the motor.

8. The electrical warning system of claim 2, 3, 4 or 5 wherein the first light-emitting diode has a red case, the second light-emitting diode has a green case, and the main resistor is selected to cause a voltage drop of about 2 volts in the power supplied to the motor.

* * * * *